(12) United States Patent
Mori et al.

(10) Patent No.: US 9,671,179 B2
(45) Date of Patent: Jun. 6, 2017

(54) LIQUID-COOLED-TYPE COOLING DEVICE

(75) Inventors: Shogo Mori, Kariya (JP); Hideyasu Obara, Kariya (JP); Taizo Kuribayashi, Oyama (JP); Shinobu Tamura, Oyama (JP)

(73) Assignee: SHOWA DENKO K.K., Tokyo (JP)

( * ) Notice: Subject to any disclaimer, the term of this patent is extended or adjusted under 35 U.S.C. 154(b) by 1124 days.

(21) Appl. No.: 12/350,441

(22) Filed: Jan. 8, 2009

(65) Prior Publication Data

US 2009/0178792 A1 Jul. 16, 2009

(30) Foreign Application Priority Data

Jan. 15, 2008 (JP) .................................. 2008-005506
Mar. 25, 2008 (JP) .................................. 2008-077298

(51) Int. Cl.
*H01L 23/473* (2006.01)
*F28F 3/12* (2006.01)
*F28F 9/02* (2006.01)

(52) U.S. Cl.
CPC .............. *F28F 3/12* (2013.01); *F28F 9/0263* (2013.01); *H01L 23/473* (2013.01); *H01L 2924/0002* (2013.01)

(58) Field of Classification Search
CPC .............................. F28F 9/0263; H01L 23/473
USPC ............ 165/80.4, 104.33, 170; 361/699, 702
See application file for complete search history.

(56) References Cited

U.S. PATENT DOCUMENTS 4,122,828 A * 10/1978 DiPeri ........................... 126/671
4,884,630 A * 12/1989 Nelson et al. ................. 165/170
5,099,311 A 3/1992 Bonde et al.
6,101,715 A * 8/2000 Fuesser et al. ............ 29/890.03
6,414,867 B2 7/2002 Suzuki et al.
(Continued)

FOREIGN PATENT DOCUMENTS

EP 1739746 A2 1/2007
JP 2001308246 A * 11/2001
(Continued)

OTHER PUBLICATIONS

U.S. Appl. No. 12/911,357, filed Oct. 25, 2010, Mori, et al.
(Continued)

*Primary Examiner* — Devon Russell
(74) *Attorney, Agent, or Firm* — Oblon, McClelland, Maier & Neustadt, L.L.P.

(57) ABSTRACT

A liquid-cooled-type cooling device includes a casing having a cooling-liquid inlet and a cooling-liquid outlet, and an outflow pipe connected to the cooling-liquid outlet. The casing includes a cooling-liquid outflow portion, and the cooling-liquid outlet is formed in a top wall of the cooling-liquid outflow portion. The outflow pipe has a bottom wall parallel to a portion of the top wall of the cooling-liquid outflow portion where the cooling-liquid outlet is formed. The bottom wall has a through hole for communication with the cooling-liquid outlet. A guide portion is provided on a portion of an upper surface of a bottom wall of the cooling-liquid outflow portion, the portion corresponding to the cooling-liquid outlet, so as to change, toward an upward direction, the flow direction of cooling liquid flowing into the cooling-liquid outflow portion. Thus, a flow resistance which cooling liquid undergoes when flowing out of the casing can be reduced.

15 Claims, 5 Drawing Sheets

(56) References Cited

U.S. PATENT DOCUMENTS

| | | | |
|---|---|---|---|
| 6,416,867 B1* | 7/2002 | Karpen | 428/426 |
| 6,978,856 B2* | 12/2005 | Nakamura et al. | 180/68.4 |
| 7,204,303 B2* | 4/2007 | Thomas et al. | 165/170 |
| 7,252,167 B2* | 8/2007 | Nakamura et al. | 180/68.4 |
| 7,278,549 B2* | 10/2007 | Munch et al. | 220/721 |
| 7,365,981 B2* | 4/2008 | Myers et al. | 361/699 |
| 7,569,957 B2* | 8/2009 | Aoki et al. | 310/64 |
| 7,641,865 B2* | 1/2010 | Tonkovich et al. | 422/129 |
| 7,660,122 B2* | 2/2010 | Nakamura et al. | 361/699 |
| 7,859,103 B2* | 12/2010 | Aoki et al. | 257/714 |
| 2001/0014029 A1 | 8/2001 | Suzuki et al. | |
| 2005/0145379 A1 | 7/2005 | Thomas et al. | |
| 2006/0225867 A1* | 10/2006 | Park et al. | 165/80.4 |
| 2007/0000656 A1 | 1/2007 | Nakahama et al. | |
| 2007/0246205 A1 | 10/2007 | Lee et al. | |

FOREIGN PATENT DOCUMENTS

| | | | | |
|---|---|---|---|---|
| JP | 2004-6811 | | 1/2004 | |
| JP | 2004103936 | A * | 4/2004 | |
| JP | 2004349324 | A * | 12/2004 | |
| JP | 2005-129599 | | 5/2005 | |
| JP | 2005-129599 | A | 5/2005 | |
| JP | 2006-295178 | | 10/2006 | |
| KR | 10-0619076 | B1 | 8/2006 | |

OTHER PUBLICATIONS

U.S. Appl. No. 12/740,024, filed Apr. 27, 2010, Mori, et al.
U.S. Appl. No. 12/546,149, filed Aug. 24, 2009, Mori, et al.
U.S. Appl. No. 12/546,423, filed Aug. 24, 2009, Mori, et al.
Official Letter from Peoples' Republic of China, dated Aug. 2, 2013, in CN Application No. 200910003546.1, filed Jan. 15, 2009.
Official Letter dated Aug. 22, 2014 issued in corresponding KR 10-2009-0002815, filed Jan. 14, 2009.
Extended European Search Report dated Jul. 12, 2013 in Application No. 09 150 555.2, filed Jan. 14, 2009.

* cited by examiner

LIQUID-COOLED-TYPE COOLING DEVICE

BACKGROUND OF THE INVENTION

The present invention relates to a liquid-cooled-type cooling device which is applied to, for example, a semiconductor power converter of a vehicle for cooling a heat-generating body, such as a semiconductor device.

A conventionally known liquid-cooled-type cooling device for cooling an electronic component is disclosed, for example, in United States Patent Application Laid-Open (kokai) No. 2005/0145379. The disclosed liquid-cooled-type cooling device includes a casing composed of upper and lower cover plates, and a channel plate interposed between the two cover plates and having a meandering cooling-liquid flow path and openings. Flat tubes are interposed between the two cover plates of the casing such that they are disposed in straight portions of the meandering cooling-liquid flow path of the channel plate. The upper cover plate has a cooling-liquid inlet and a cooling-liquid outlet at positions corresponding to the opposite ends of the cooling-liquid flow path. An inlet member having a coolant-liquid inflow passage which communicates with the cooling-liquid inlet and an outlet member having a coolant-liquid outflow passage which communicates with the cooling-liquid outlet are joined to an upper surface of the upper cover plate.

In the liquid-cooled-type cooling device disclosed in the above-mentioned publication, as shown FIG. 6, after hitting against a closed end surface 52 of a flow path 51 of a casing 50, cooling liquid flows upward, and flows into a cooling-liquid outflow passage 54 of an outlet member 53 via a cooling-liquid outlet 55. Therefore, when the height of the flow path 51 is high, a relatively large swirl W is generated at an internal corner portion between the lower surface of the flow path 51 and the closed end surface 52, so that flow resistance increases, and pressure loss increases.

Further, in the liquid-cooled-type cooling device disclosed in the above-mentioned publication, as shown FIG. 7, after hitting against a closed end surface 62 of a cooling-liquid inflow passage 61 of an inlet member 60, the cooling liquid flows downward while sharply changing its flow direction, and flows into a casing 64 via a cooling-liquid inlet 63. Therefore, when the cooling liquid flows into the casing 64, the cooling liquid hits the upper surface of the bottom wall 65 of the casing 64 from the upper side, whereby a relatively large swirl W1 is generated at an internal corner portion between the side wall 66 and the bottom wall 65 of the casing 64, and flow resistance and pressure loss increase.

SUMMARY OF THE INVENTION

An object of the present invention is to solve the above-mentioned problems and to provide a liquid-cooled-type cooling device which can reduce a flow resistance which cooling liquid undergoes when flowing out of the casing thereof.

Another object of the present invention is to solve the above-mentioned problems and to provide a liquid-cooled-type cooling device which can reduce a flow resistance which cooling liquid undergoes when flowing into the casing thereof.

To achieve the above object, the present invention comprises the following modes.

1) A liquid-cooled-type cooling device comprising a casing having a cooling-liquid inlet and a cooling-liquid outlet, and an outflow pipe connected to the cooling-liquid outlet of the casing, wherein the casing includes a cooling-liquid outflow portion having a closed distal end, and the cooling-liquid outlet is formed in a top wall of the cooling-liquid outflow portion; the outflow pipe has a bottom wall which is parallel to a portion of the top wall of the cooling-liquid outflow portion, the portion having the cooling-liquid outlet, and which has a through hole for communication with the cooling-liquid outlet; and a guide portion is provided on a portion of an upper surface of a bottom wall of the cooling-liquid outflow portion, the portion corresponding to the cooling-liquid outlet, so as to change, toward an upward direction, the flow direction of cooling liquid flowing into the cooling-liquid outflow portion.

2) A liquid-cooled-type cooling device according to par. 1), wherein a raised portion which is parallel to the upper surface of the bottom wall of the cooling-liquid outflow portion is provided via a step portion on the portion of the upper surface of the bottom wall, the portion corresponding to the cooling-liquid outlet, and the step portion and the raised portion form the guide portion.

3) A liquid-cooled-type cooling device according to par. 2), wherein the guide portion is formed by means for deforming the bottom wall of the cooling-liquid outflow portion.

4) A liquid-cooled-type cooling device according to par. 1), wherein a downward deviating portion which deviates downward is provided on a portion of a lower surface of a top wall of the cooling-liquid outflow portion of the casing, the portion being located on a distal end side of the cooling-liquid outlet.

5) A liquid-cooled-type cooling device according to par. 4), wherein the downward deviating portion is formed by a skewed portion which is skewed downward toward the cooling-liquid outlet, 6) A liquid-cooled-type cooling device according to par. 5), wherein the downward deviating portion is formed by means of deforming the top wall of the cooling-liquid outflow portion.

7) A liquid-cooled-type cooling device comprising a casing having a cooling-liquid inlet and a cooling-liquid outlet, and an inflow pipe connected to the cooling-liquid inlet of the casing, wherein the cooling-liquid inlet is formed in an end portion of a top wall of the casing; the inflow pipe has a bottom wall which is placed on a portion of the top wall of the casing, the portion having the cooling-liquid inlet, and which has a through hole for communication with the cooling-liquid inlet; and a guide portion is provided on a portion of an upper surface of a bottom wall of the casing, the portion corresponding to the cooling-liquid inlet, so as to cause cooling liquid flowing into the casing to flow in a skewed downward direction.

8) A liquid-cooled-type cooling device according to par. 7), wherein the guide portion is skewed downward from the upstream side toward the downstream side with respect to a flow direction of the cooling liquid.

9) A liquid-cooled-type cooling device according to par. 8), wherein the guide portion is formed by means for deforming the bottom wall of the casing.

10) A liquid-cooled-type cooling device according to par. 7), wherein a downward deviating portion which deviates downward is provided on a portion of a lower surface of a top wall of the casing, the portion being located on a downstream side of the cooling-liquid inlet with respect to the flow direction of the cooling liquid.

11) A liquid-cooled-type cooling device according to par. 10), wherein the downward deviating portion is formed by a skewed portion which is skewed downward toward the cooling-liquid inlet, 12) A liquid-cooled-type cooling device according to par. 11), wherein the downward deviating portion is formed by means of deforming the top wall of the casing.

13) A liquid-cooled-type cooling device according to par. 7), wherein a cooling-liquid inflow portion which generally assumes the form of a rectangular tube is formed on one side wall of the casing, the cooling-liquid inflow portion projecting outward from the side wall and having a closed distal end, and the cooling-liquid inlet is formed in a distal end portion of a top wall of the cooling-liquid inflow portion.

14) A liquid-cooled-type cooling device according to par. 1) or 7), wherein a peripheral wall of the casing includes a first side wall and a second side wall positioned in opposition to each other; a cooling liquid inflow portion is provided at one end portion of the first side wall, the cooling liquid inflow portion projecting outward from the first side wall and having a closed distal end; the cooling-liquid inlet is formed in a distal end portion of a top wall of the cooling liquid inflow portion; a cooling liquid outflow portion is provided at one end portion of the second side wall opposite the other end portion thereof corresponding to the one end portion of the first side wall, the cooling liquid outflow portion projecting outward from the second side wall and having a closed distal end; the cooling-liquid outlet is formed in a distal end portion of a top wall of the cooling liquid outflow portion; a parallel-flow-channel section is provided in an internal region located between the first side wall and the second side wall and between the cooling-liquid inflow portion and the cooling-liquid outflow portion and includes a plurality of flow channels through which cooling liquid flows in a longitudinal direction of the first and second side walls; an internal region of the casing located upstream of the parallel-flow-channel section serves as an inlet header section communicating with the cooling-liquid inflow portion, and an internal region of the casing located downstream of the parallel-flow-channel section serves as an outlet header section communicating with the cooling-liquid outflow portion.

According to the liquid-cooled-type cooling device of any one of pars. 1) to 6), a guide portion for changing, toward an upward direction, the flow direction of the cooling liquid flowing into the cooling-liquid outflow portion is provided at a portion of the upper surface of the bottom wall of the cooling-liquid outflow portion of the casing, the portion corresponding to the cooling-liquid outlet. Therefore, when the cooling liquid flows from the interior of the cooling-liquid outflow portion of the casing to the outflow pipe through the cooling-liquid outlet, the flow direction of the cooling liquid is changed toward an upward direction by the action of the guide portion. Accordingly, in the case where the internal height of the cooling-liquid outflow portion of the casing is made equal to the height of the flow path of the liquid-cooled-type cooling device disclosed in the above-described publication, the size of a swirl generated within the cooling-liquid outflow portion in the vicinity of the cooling-liquid outlet becomes smaller that that of a corresponding swirl generated in the liquid-cooled-type cooling device disclosed in the above-described publication. Thus, the flow resistance which the cooling liquid undergoes when flowing from the interior of the cooling-liquid outflow portion to the outflow pipe via the cooling-liquid outlet is reduced, and pressure loss decreases.

According to the liquid-cooled-type cooling device of par. 4), the distance between the center line of the interior the cooling-liquid outflow portion of the casing with respect to the vertical direction and the center line of the outflow pipe with respect to the vertical direction can be reduced. Therefore, the angle of the flow of the cooling liquid at the time when it flows from the interior of the cooling liquid outflow portion to the outflow pipe via the cooling liquid outlet can be reduced. As a result, it becomes possible to improve the effect of reducing the flow resistance which the cooling liquid undergoes when flowing from the interior of the casing to the outflow pipe via the cooling liquid outlet.

According to the liquid-cooled-type cooling device of par. 5), it becomes possible to reliably improve the effect of reducing the flow resistance which the cooling liquid undergoes when flowing from the interior of the cooling-liquid outflow portion of the casing to the outflow pipe via the cooling liquid outlet.

According to the liquid-cooled-type cooling device of any one of pars. 7) to 13), a guide portion for causing the cooling liquid flowing into the casing to flow in a skewed downward direction is provided at a portion of the upper surface of the bottom wall of the casing, the portion corresponding to the cooling-liquid inlet. Therefore, when the cooling liquid flows into the casing through the cooling-liquid inlet, the cooling liquid flows in the skewed downward direction due to the action of the guide portion. Accordingly, in the case where the internal height of the casing is made equal to the height of the flow path of the liquid-cooled-type cooling device disclosed in the above-described publication, the size of a swirl generated in the vicinity of the cooling-liquid inlet becomes smaller that that of a corresponding swirl generated in the liquid-cooled-type cooling device disclosed in the above-described publication. Thus, the flow resistance which the cooling liquid undergoes when flowing into the casing via the cooling-liquid inlet is reduced, and pressure loss decreases.

According to the liquid-cooled-type cooling device of any one of pars. 10) to 12), the distance between the center line of the casing with respect to the vertical direction and the center line of the inflow pipe with respect to the vertical direction can be reduced. Therefore, the bent angle of the flow of the cooling liquid at the time when it flows from the inflow pipe into the casing via the cooling liquid inlet can be reduced. As a result, it becomes possible to improve the effect of reducing the flow resistance which the cooling liquid undergoes when flowing into the casing via the cooling liquid inlet.

DESCRIPTION OF THE PREFERRED EMBODIMENT

An embodiment of the present invention will next be described in detail with reference to the drawings.

In the following description, the lower and upper sides of FIG. 2 will be referred to as "front" and "rear," respectively. Further, the upper, lower, left-hand, and right-hand sides of FIG. 3 will be referred to as "upper," "lower," "left," and "right," respectively.

In the following description, the term "aluminum" encompasses aluminum alloys in addition to pure aluminum.

Figure 1:
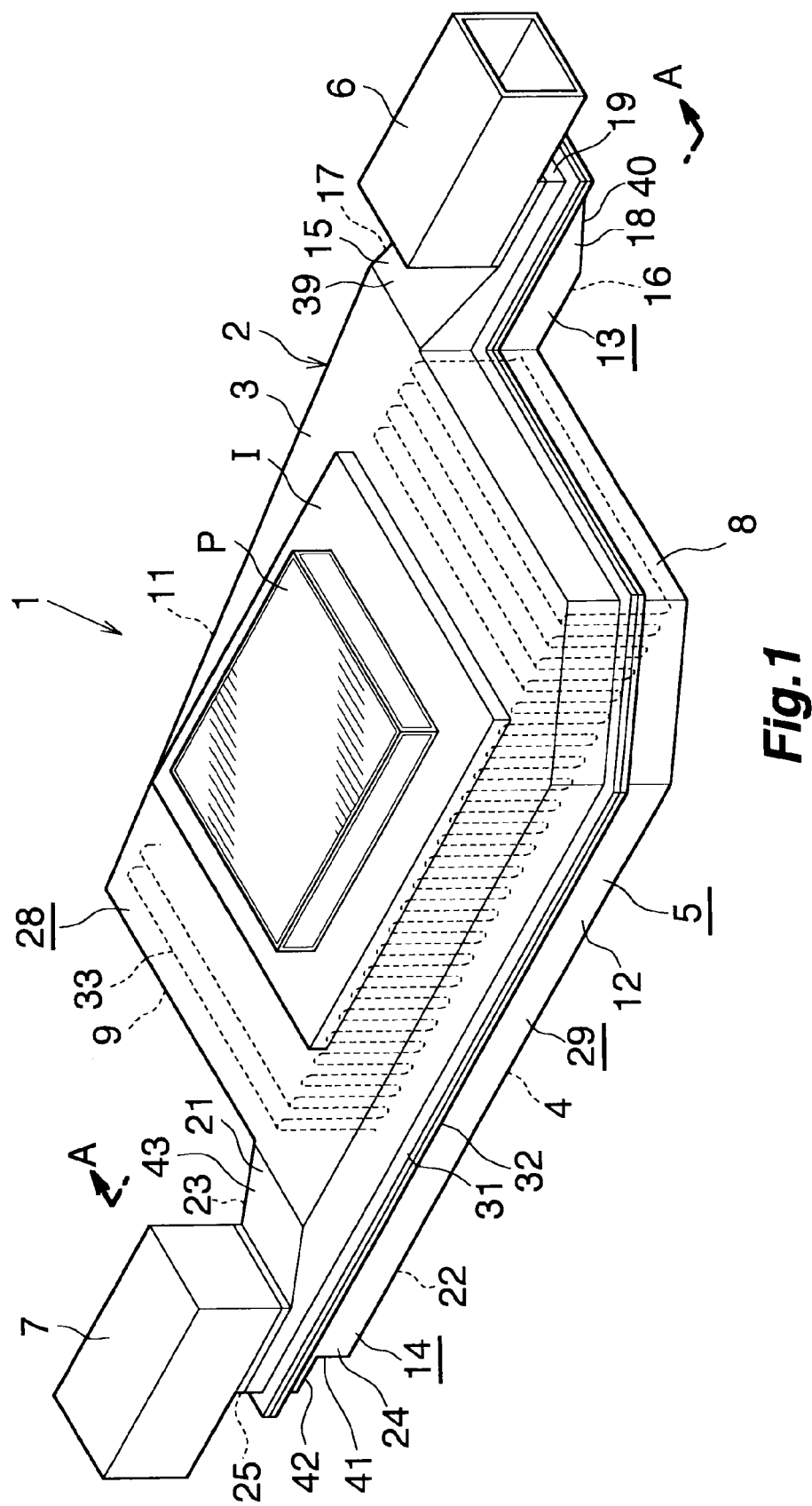
FIG. 1 is a perspective view showing the overall structure of a liquid-cooled-type cooling device according to the present invention.
Figure 2:
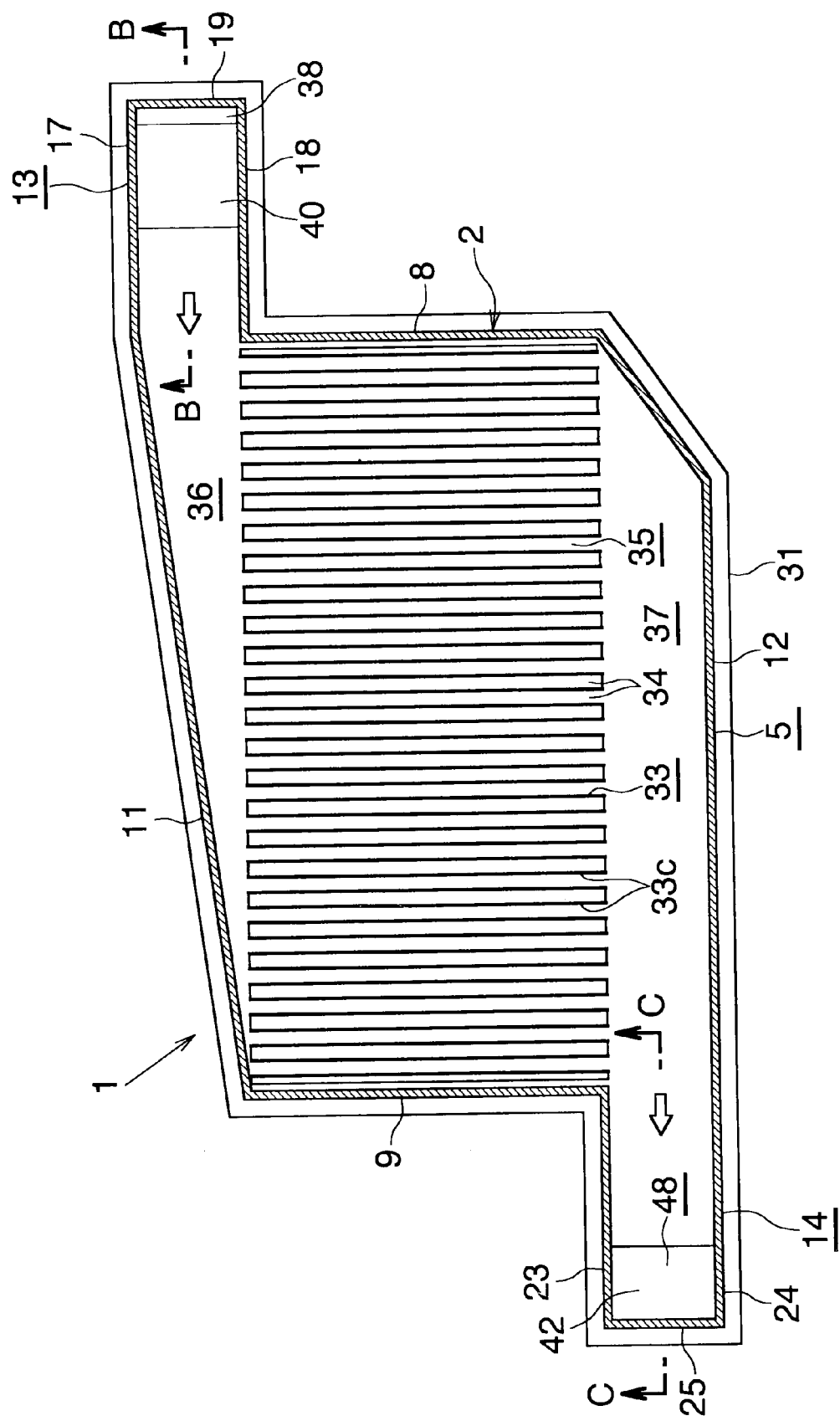
FIG. 2 is a horizontal sectional view of the liquid-cooled-type cooling device of FIG. 1.
Figure 3:
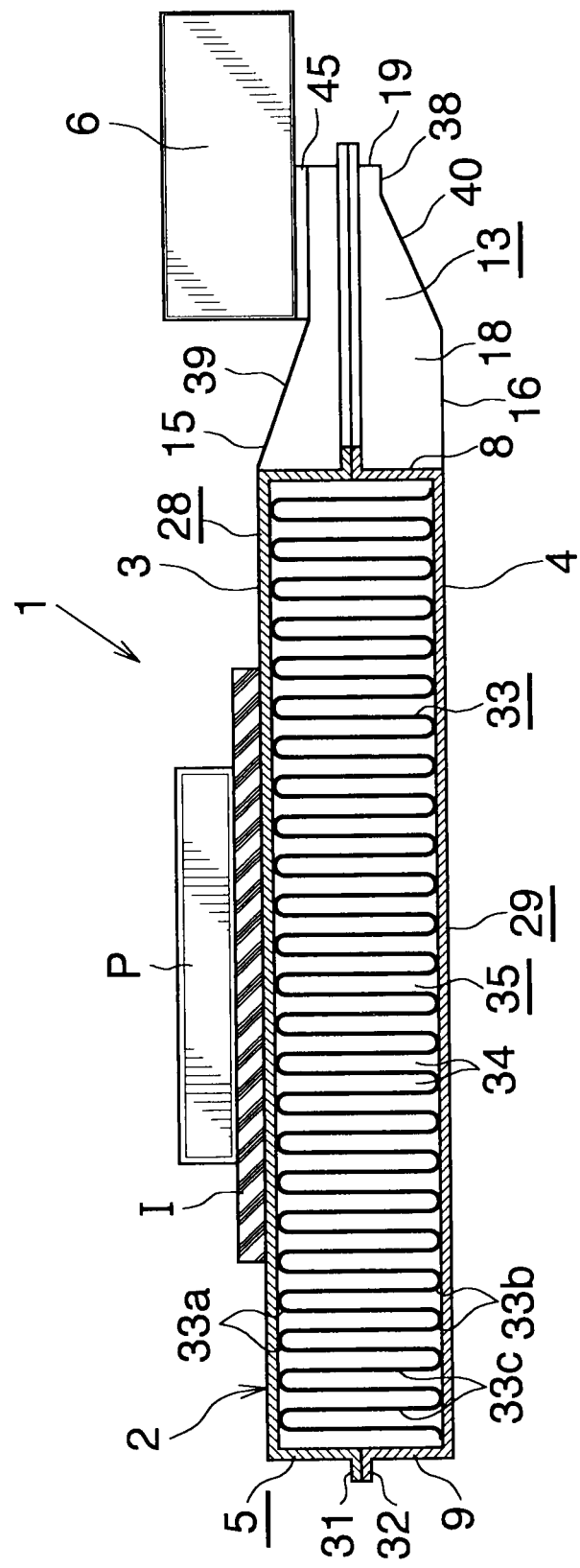
FIG. 3 is a sectional view taken along line A-A of FIG. 1.
Figure 4:
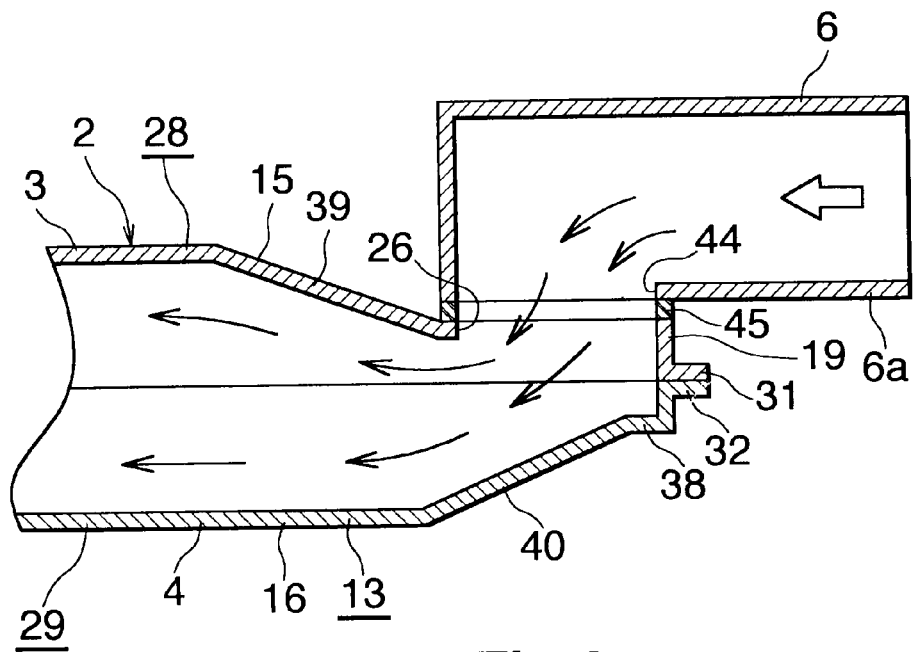
FIG. 4 is an enlarged sectional view taken along line B-B of FIG. 2.
Figure 5:
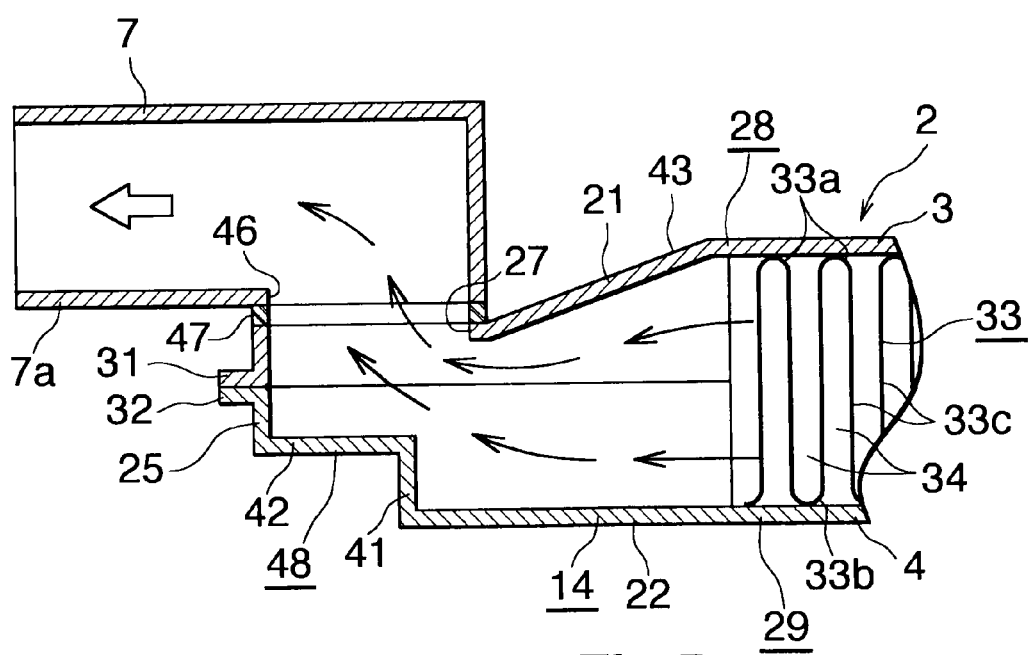
FIG. 5 is an enlarged sectional view taken along line C-C of FIG. 2.
Figure 6:
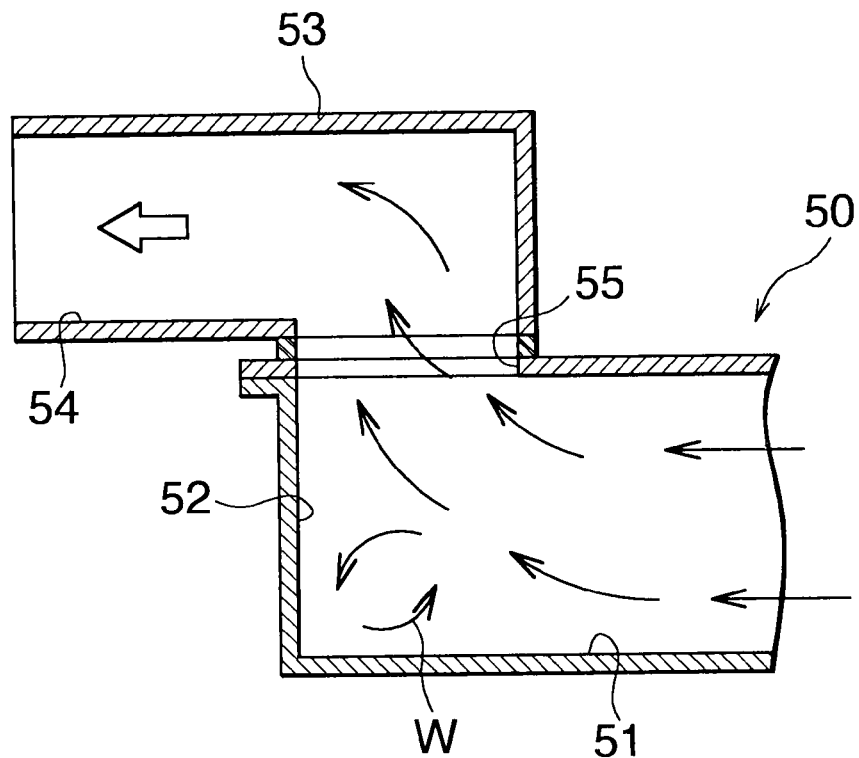
FIG. 6 is a sectional view corresponding to FIG. 5 and showing a problem of a conventional liquid-cooled-type cooling device.
Figure 7:
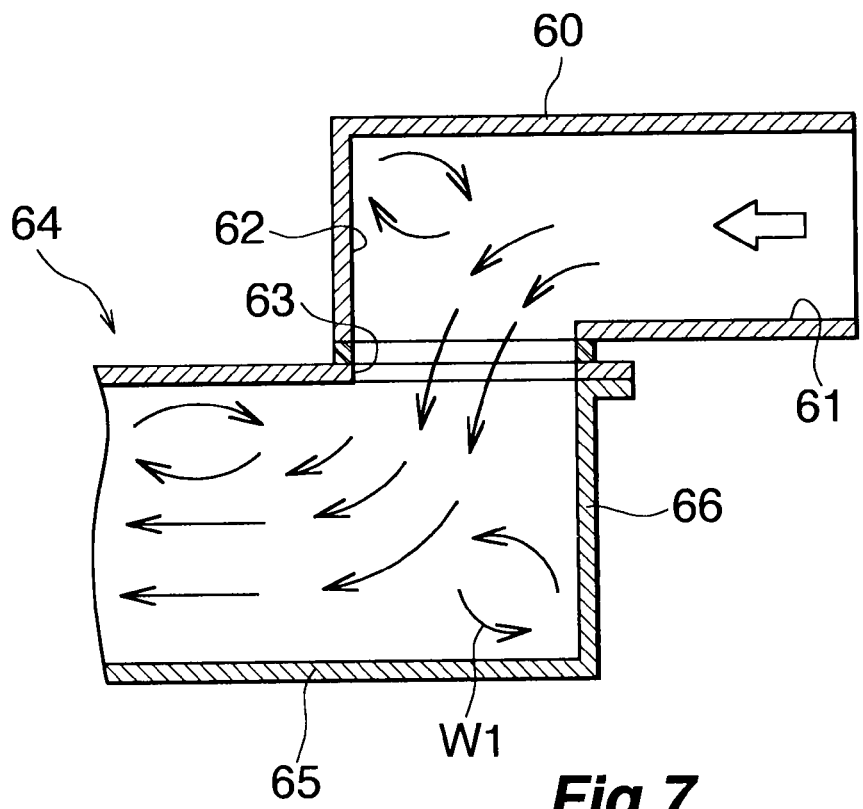
FIG. 7 is a sectional view corresponding to FIG. 4 and showing another problem of the conventional liquid-cooled-type cooling device.

FIGS. 1 to 3 show the overall structure of a liquid-cooled-type cooling device according to the present invention; and FIGS. 4 and 5 show the structure of a main portion of the cooling device. Notably, FIG. 1 shows a state in which a semiconductor device, which is a heat-generating body, is mounted on the liquid-cooled-type cooling device.

In FIGS. 1 to 3, a liquid-cooled-type cooling device 1 comprises a casing 2 which includes a top wall 3, a bottom wall 4, and a peripheral wall 5; an inflow pipe 6 brazed to the top wall 3 and adapted to introduce a cooling liquid into the casing 2; and an outflow pipe 7 brazed to the top wall 3 and adapted to discharge the cooling liquid from the casing 2.

As shown FIGS. 2 to 5, the peripheral wall 5 of the casing 2 includes a right side wall 8 (first side wall), which extends in the front-rear direction and stands vertically; a left side wall 9 (second side wall), which extends in the front-rear direction, stands vertically, and is positioned in opposition to the right side wall 8; a rear side wall 11, which connects to a rear end portion of the left side wall 9, extends rightward, and stands vertically; and a front side wall 12, which connects to a front end portion of the right side wall 8, extends leftward, and stands vertically. A coolant-liquid inflow portion 13 is integrally formed at a rear end portion of the casing 2 such that the coolant-liquid inflow portion 13 projects rightward. Similarly, a coolant-liquid outflow portion 14 is integrally formed at a front end portion of the casing 2 such that the coolant-liquid outflow portion 14 projects leftward. Each of the coolant-liquid inflow portion 13 and the coolant-liquid outflow portion 14 has a constant width in the front-rear direction over the entire length thereof. The coolant-liquid inflow portion 13 includes a top wall 15 connecting to the top wall 3 of the casing 2; a bottom wall 16 connecting to the bottom wall 4 of the casing 2; a rear side wall 17 connecting to the rear side wall 11 of the casing 2; a front side wall 18 connecting to the right side wall 8 of the casing 2 and forming a right angle in relation to the right side wall 8; and a right end wall 19 integrally formed at right end portions of the top wall 15, the bottom wall 16, the rear side wall 17, and the front side wall 18. The right end wall 19 closes a distal end of the coolant-liquid inflow portion 13. The coolant-liquid outflow portion 14 includes a top wall 21 connecting to the top wall 3 of the casing 2; a bottom wall 22 connecting to the bottom wall 4 of the casing 2; a rear side wall 23 connecting to the left side wall 9 of the casing 2 and forming a right angle in relation to the left side wall 9; a front side wall 24 connecting to the front side wall 12 of the casing 2; and a left end wall 25 integrally formed at left end portions of the top wall 21, the bottom wall 22, the rear side wall 23, and the front side wall 24. The left end wall 25 closes a distal end of the coolant-liquid outflow portion 14. A square coolant-liquid inlet 26 is formed in a right end portion of the top wall 15 of the coolant-liquid inflow portion 13. A square coolant-liquid outlet 27 is formed in a left end portion of the top wall 21 of the coolant-liquid outflow portion 14.

The casing 2 having the coolant-liquid inflow portion 13 and the coolant-liquid outflow portion 14 formed integrally therewith is composed of an upper structure member 28 of aluminum and a lower structure member 29 of aluminum. The upper structure member 28 includes the top wall 3, a portion forming an upper half of the peripheral wall 5, the top wall 15, a portion forming an upper half of the rear side wall 17, a portion forming an upper half of the front side wall 18, a portion forming an upper half of the right end wall 19, the top wall 21, a portion forming an upper half of the rear side wall 23, a portion forming an upper half of the front side wall 24, and a portion forming an upper half of the left end wall 25. The lower structure member 29 includes the bottom wall 4, a portion forming a lower half of the peripheral wall 5, the bottom wall 16, a portion forming an lower half of the rear side wall 17, a portion forming a lower half of the front side wall 18, a portion forming a lower half of the right end wall 19, the bottom wall 22, a portion forming a lower half of the rear side wall 23, a portion forming a lower half of the front side wall 24, and a portion forming a lower half of the left end wall 25. A lower end portion of the upper structure member 28 and an upper end portion of the lower structure member 29 have integrally formed outward flanges 31 and 32, respectively. The outward flanges 31 and 32 of the upper and lower structure members 28 and 29 are brazed together. The upper and lower structure members 28 and 29 are each formed from an aluminum plate through press working.

An aluminum corrugated fin 33 is disposed in an internal region of the casing 2 located between the right side wall 8 and the left side wall 9 and between the cooling-liquid inflow portion 13 and the cooling-liquid outflow portion 14. The corrugated fin 33 includes wave crest portions 33a, wave trough portions 33b, and vertical connection portions 33c connecting respective wave crest portions 33a and wave trough portions 33b. The wave crest portions 33a are brazed to the top wall 3 of the casing 2, whereas the wave trough portions 33b are brazed to the bottom wall 4 of the casing 2. The corrugated fin 33 forms a plurality of flow channels 34 which extend in the front-rear direction and are arranged in the left-right direction and through which cooling liquid flows in the front-rear direction (longitudinal direction of the right and left walls 8 and 9), thereby providing a parallel-flow-channel section 35 including a plurality of flow channels. An internal region of the casing 2 located upstream (rearward) of the parallel-flow-channel section 35 serves as an inlet header section 36 communicating with the cooling-liquid inlet 26 of the cooling-liquid inflow portion 13. An internal region of the casing 2 located downstream (frontward) of the parallel-flow-channel section 35 serves as an outlet header section 37 communicating with the cooling-liquid outlet 27 of the cooling-liquid outflow portion 14. The inlet header section 36, the outlet header section 37, and the parallel-flow-channel section 35 of the casing 2 have the same height. The width of the right end portion of the inlet header section 36 as measured in the front-rear direction is equal to that of the cooling-liquid inflow portion 13, and the width of the left end portion of the outlet header section 37 as measured in the front-rear direction is equal to that of the cooling-liquid outflow portion 14.

The entire rear side wall 11 of the casing 2; specifically, the inner surface of the rear side wall 11, is smoothly skewed frontward in a direction from the side toward the right side wall 8 to the side toward the left side wall 9. As a result, the cross-sectional flow-channel area of the inlet header section 36 reduces in a direction from the side toward the cooling-liquid inlet 26 to the side toward the left side wall 9. Also, in a portion of the outlet header section 37 which extends from the right side wall 8 toward the left side wall 9 and whose length is 20% or less that of the outlet header section 37, the front side wall 12; specifically, the inner surface of the front side wall 12, is skewed rearward in a direction from the side toward the left side wall 9 to the side toward the right side wall 8. In the remaining portion of the outlet header section 37, the front side wall 12; specifically, the inner surface of the front side wall 12, is perpendicular to the inner surfaces of the right and left side walls 8 and 9. As a result, the portion of the outlet header section 37 which extends from the right side wall 8 of the casing 2 toward the left side wall 9 and whose length is 20% or less that of the outlet header section 37 reduces in cross-sectional flow-channel area in a direction from the side toward the left side wall 9 to the side toward the right side wall 8, whereas the remaining portion of the outlet header section 37 is uniform in cross-sectional flow-channel area along the entire length of the remaining portion.

As shown in FIG. 4, a guide portion 40 is provided at a portion of the bottom wall 16 of the cooling-liquid inflow portion 13, the portion facing the cooling-liquid inlet 26. The guide portion 40 is formed of a skewed portion which is skewed downward toward the left side (the downstream side with respect to the flow direction), and guides the cooling liquid entering the cooling-liquid inflow portion 13 of the casing 2 to flow in a skewed downward direction. An upper end portion of the skewed guide portion 40 connects to the right end wall 19 via a horizontal strip-shaped connection portion 38. The guide portion 40 is formed by means of deforming the bottom wall 16 over an area extending from a position located leftward of the left end of the cooling-liquid inlet 26 to a position located leftward of the right end of the cooling-liquid inlet 26. Further, a downward deviating portion 39, which deviates downward, is provided on a portion of the top wall 15 of the cooling-liquid inflow portion 13, the portion being located on the proximal end side (left side) of the cooling-liquid inlet 26. The downward deviating portion 39 is formed of a skewed portion which is skewed downward toward the right side. The downward deviating portion 39 is formed by means of partially deforming the top wall 15.

As shown in FIG. 5, a raised portion 42 is provided via a step portion 41 on a portion of the bottom wall 22 of the cooling-liquid outflow portion 14, the portion facing the cooling-liquid outlet 27. The raised portion 42 is parallel to the upper surface of the bottom wall 22. The step portion 41 and the raised portion 42 form a guide portion 48 for changing, toward an upward direction, the flow direction of the cooling liquid entering the cooling-liquid outflow portion 14. The guide portion 48 is formed by means of deforming the bottom wall 22 over an area extending from a position located leftward of the right end of the cooling-liquid outlet 27 to a position located at the left end of the cooling-liquid outlet 27. Further, a downward deviating portion 43, which deviates downward, is provided on a portion of the top wall 21 of the cooling-liquid outflow portion 14, the portion being located on the proximal end side (right side) of the cooling-liquid outlet 27. The downward deviating portion 43 is formed of a skewed portion which is skewed downward toward the left side. The downward deviating portion 43 is formed by means of partially deforming the top wall 21.

The inflow pipe 6 is formed of a rectangular tube having a square transverse cross section with one end open and the other end closed. A square through hole 44, which matches the cooling-liquid inlet 26 of the cooling-liquid inflow portion 13, is formed in a closed end portion (a left end portion) of a lower wall 6a of the inflow pipe 6. The inflow pipe 6 is brazed to the cooling-liquid inflow portion 13 such that the lower wall 6a becomes parallel to a portion of the top wall 15 of the cooling-liquid inflow portion 13, the portion having the cooling-liquid inlet 26; i.e., located on the rightward of the downward deviating portion 39. Specifically, a portion of the lower surface of the lower wall 6a around the through hole 44 is brazed to a portion of the upper surface of the top wall 15 of the cooling-liquid inflow portion 13 around the cooling-liquid inlet 26 via a frame-shaped spacer 45. Although not shown in the drawings, a cooling-liquid supply tube is connected to the open end portion of the inflow pipe 6.

The outflow pipe 7 is formed of a rectangular tube having a square transverse cross section with one end open and the other end closed. A square through hole 46, which matches the cooling-liquid outlet 27 of the cooling-liquid outflow portion 14, is formed in a closed end portion (a right end portion) of a lower wall 7a of the outflow pipe 7. The outflow pipe 7 is brazed to the cooling-liquid outflow portion 14 such that the lower wall 7a becomes parallel to a portion of the top wall 21 of the cooling-liquid outflow portion 14, the portion having the cooling-liquid outlet 27; i.e., located on the leftward of the downward deviating portion 43. Specifically, a portion of the lower surface of the lower wall 7a around the through hole 46 is brazed to a portion of the upper surface of the top wall 21 of the cooling-liquid outflow portion 14 around the cooling-liquid outlet 27 via a frame-shaped spacer 47. Although not shown in the drawings, a cooling-liquid discharge tube is connected to the open end portion of the outflow pipe 7.

A semiconductor device P, which is a heat-generating body, is joined to the outer surface of the top wall 3 of the casing 2 via a plate-like insulating member I.

In the liquid-cooled-type cooling device 1 having the above-described configuration, a cooling liquid fed from the cooling-liquid supply tube into the inflow pipe 6 flows into the cooling-liquid inflow portion 13 of the casing 2 through the through hole 44 and the cooling-liquid inlet 26. At that time, due to the action of the guide portion 40 of the bottom wall 16 of the cooling-liquid inflow portion 13 and the action of the downward deviating portion 39 of the top wall 15 thereof, flow resistance is reduced, and an increase in pressure loss is prevented. The cooling liquid having flowed into the cooling-liquid inflow portion 13 flows into the inlet header section 36. In the inlet header section 36, the cooling liquid flows into all of the flow channels 34 of the parallel-flow-channel section 35 in a uniformly divided condition and flows frontward through the flow channels 34. At this time, since the entire rear side wall 11 of the casing 2; specifically, the inner surface of the rear side wall 11, is smoothly skewed frontward in a direction from the side toward the right side wall 8 to the side toward the left side wall 9, and thus the cross-sectional flow-channel area of the inlet header section 36 reduces in a direction from the side toward the cooling-liquid inlet 26 to the side toward the left side wall 9, the distribution of flow velocities in all the flow channels 34 of the parallel-flow-channel section 35; i.e., the distribution of flow velocities along the direction of width of the parallel-flow-channel section 35, becomes uniform.

The cooling liquid which has flowed frontward through the flow channels 34 of the parallel-flow-channel section 35 enters the outlet header section 37, and flows leftward through the outlet header section 37 and enters the liquid outflow portion 14. The cooling liquid having entered the liquid outflow portion 14 flows into the outflow pipe 7 via the cooling-liquid outlet 27 and the through hole 46. At that time, due to the action of the guide portion 48 formed on the bottom wall 22 of the liquid outflow portion 14, the flow direction of the cooling liquid is changed toward the upward direction, whereby the size of a swirl generated in the vicinity of the cooling-liquid outlet 27 of the liquid outflow portion 14 becomes relatively small. Accordingly, the flow resistance which the cooling liquid undergoes when flowing from the interior of the casing 2 to the outflow pipe 7 via the cooling-liquid outlet 27 is reduced, and an increase in pressure loss is prevented. Further, due to the action of the downward deviating portion 43 of the top wall 21 of the liquid outflow portion 14, the distance between the center line of the interior of the casing 2 with respect to the vertical direction and the center line of the outflow pipe 7 with respect to the vertical direction becomes short, whereby the angle of the flow of the cooling liquid at the time when it flows from the interior of the cooling-liquid outflow portion 14 to the outflow pipe 7 via the cooling liquid outlet 27 can be reduced. Thus, it becomes possible to improve the effect of reducing the flow resistance which the cooling liquid undergoes when flowing from the interior of the outflow portion 14 to the outflow pipe 7 via the cooling liquid outlet 27. The cooling liquid having flowed into the outflow pipe 7 is fed into the cooling-liquid discharge tube.

Heat generated from the semiconductor device P is transmitted to the cooling liquid which flows through the flow channels 34, via the insulating member I, the top wall 3 of the casing 2, and the corrugated fin 33. The semiconductor device P thus is cooled.

What is claimed is:

1. A liquid-cooled-type cooling device comprising:
   a casing having a top wall including a cooling-liquid inlet and a cooling-liquid outlet, and having a bottom wall opposing the top wall; and
   an outflow pipe coupled to the cooling-liquid outlet of the casing,
   wherein the casing includes a cooling-liquid outflow portion having a top wall portion extending from the top wall of the casing, a bottom wall portion extending from the bottom wall of the casing and opposing the top wall portion to define a flow space between the top wall portion and the bottom wall portion, the cooling-liquid outlet is formed in the top wall portion of the cooling-liquid outflow portion, the bottom wall portion comprises a guide portion which is directly opposite to at least part of the cooling-liquid outlet, and a closed distal end extending from an end of the guide portion to the cooling liquid outlet formed in the top wall portion of the cooling-liquid outflow portion;
   wherein the outflow pipe has a bottom wall which is parallel to the top wall of the casing and is connected to the cooling-liquid outflow portion such that a through hole in the bottom wall of the outflow pipe corresponds to and is in communication with the cooling-liquid outlet, and
   wherein the guide portion of the cooling-liquid outflow portion is configured to change a flow direction of cooling liquid flowing from a first flow direction toward the closed distal end, to a second flow direction which is an upward direction along the closed distal end toward the cooling-liquid outlet.

2. A liquid-cooled-type cooling device according to claim 1, wherein the guide portion includes a raised portion and a step portion, the raised portion is provided parallel to the upper surface of the bottom wall of the cooling-liquid outflow portion via the step portion on the upper surface of the bottom wall.

3. A liquid-cooled-type cooling device according to claim 2, wherein the guide portion is formed by deforming the bottom wall of the cooling-liquid outflow portion.

4. A liquid-cooled-type cooling device according to claim 1, wherein the top wall of the cooling-liquid outflow portion of the casing is provided with a downward deviating portion which deviates downward on a distal end side of the cooling-liquid outlet.

5. A liquid-cooled-type cooling device according to claim 4, wherein the downward deviating portion is formed by a skewed portion which is skewed downward toward the cooling-liquid outlet.

6. A liquid-cooled-type cooling device according to claim 5, wherein the downward deviating portion is formed by deforming the top wall portion of the cooling-liquid outflow portion.

7. A liquid-cooled-type cooling device according to claim 1, wherein: a peripheral wall of the casing includes a first side wall and a second side wall positioned in opposition to each other; a cooling liquid inflow portion is provided at one end portion of the first side wall, the cooling liquid inflow portion projecting outward from the first side wall and having a closed distal end; the cooling-liquid inlet is formed in a distal end portion of a top wall portion of the cooling liquid inflow portion; the cooling liquid outflow portion is provided at one end portion of the second side wall opposite the other end portion thereof corresponding to the one end portion of the first side wall, the cooling liquid outflow portion projecting outward from the second side wall and having the closed distal end; the cooling-liquid outlet is formed in a distal end portion of the top wall portion of the cooling liquid outflow portion; a parallel-flow-channel section is provided in an internal region located between the first side wall and the second side wall and between the cooling-liquid inflow portion and the cooling-liquid outflow portion and includes a plurality of flow channels through which cooling liquid flows in a longitudinal direction of the first and second side walls; an internal region of the casing located upstream of the parallel-flow-channel section serves as an inlet header section communicating with the cooling-liquid inflow portion, and an internal region of the casing located downstream of the parallel-flow-channel section serves as an outlet header section communicating with the cooling-liquid outflow portion.

8. A liquid-cooled-type cooling device comprising:
   a casing having a top wall including a cooling-liquid inlet and a cooling-liquid outlet, and having a bottom wall opposing the top wall; and
   an inflow pipe coupled to the cooling-liquid inlet of the casing,
   wherein the casing includes a cooling liquid inlet portion having a top wall portion extending from the top wall of the casing, a bottom wall portion extending from the bottom wall of the casing and opposing the top wall portion to define a flow space between the top wall portion and the bottom wall portion, the cooling-liquid inlet is formed in the top wall portion of the cooling-liquid inflow portion, and the bottom wall portion comprises a guide portion which is directly opposite to at least part of the cooling liquid inlet, wherein the inflow pipe has a bottom wall which is placed on the top wall portion extending from the top wall of the casing and is connected to the cooling liquid inflow portion such that a through hole in the bottom wall of the inflow pipe corresponds to and is in communication with the cooling-liquid inlet, and wherein the guide portion of the bottom wall portion is configured to cause the cooling liquid flowing into the casing to flow in a skewed downward direction on an upper surface of the guide portion toward the bottom wall of the casing.

9. A liquid-cooled-type cooling device according to claim 8, wherein the guide portion is skewed downward from the upstream side toward the downstream side with respect to a flow direction of the cooling liquid.

10. A liquid-cooled-type cooling device according to claim 9, wherein the guide portion is formed by deforming the bottom wall portion.

11. A liquid-cooled-type cooling device according to claim 8, wherein the top wall portion has a lower surface with a downward deviating portion which deviates downward on a downstream side of the cooling-liquid inlet with respect to the flow direction of the cooling liquid.

12. A liquid-cooled-type cooling device according to claim 11, wherein the downward deviating portion is formed by a skewed portion which is skewed downward toward the cooling-liquid inlet.

13. A liquid-cooled-type cooling device according to claim 12, wherein the downward deviating portion is formed by deforming the top wall of the casing.

14. A liquid-cooled-type cooling device according to claim 8, wherein the cooling-liquid inflow portion has a form of substantially a rectangular tube on one side wall of the casing such that the cooling-liquid inflow portion is projecting outward from the side wall and has a closed distal end, and the cooling-liquid inlet is formed in a distal end portion of a top wall of the cooling-liquid inflow portion.

15. A liquid-cooled-type cooling device according to claim 8, wherein: a peripheral wall of the casing includes a first side wall and a second side wall positioned in opposition to each other; the cooling liquid inflow portion is provided at one end portion of the first side wall, the cooling liquid inflow portion projecting outward from the first side wall and having a closed distal end; the cooling-liquid inlet is formed in a distal end portion of a top wall portion of the cooling liquid inflow portion; a cooling liquid outflow portion is provided at one end portion of the second side wall opposite the other end portion thereof corresponding to the one end portion of the first side wall, the cooling liquid outflow portion projecting outward from the second side wall and having a closed distal end; the cooling-liquid outlet is formed in a distal end portion of a top wall portion of the cooling liquid outflow portion; a parallel-flow-channel section is provided in an internal region located between the first side wall and the second side wall and between the cooling-liquid inflow portion and the cooling-liquid outflow portion and includes a plurality of flow channels through which cooling liquid flows in a longitudinal direction of the first and second side walls; an internal region of the casing located upstream of the parallel-flow-channel section serves as an inlet header section communicating with the cooling-liquid inflow portion, and an internal region of the casing located downstream of the parallel-flow-channel section serves as an outlet header section communicating with the cooling-liquid outflow portion.

* * * * *